United States Patent
Lee et al.

(10) Patent No.: US 8,623,739 B2
(45) Date of Patent: Jan. 7, 2014

(54) METHOD OF MANUFACTURING SEMICONDUCTOR DEVICE USING ACID DIFFUSION

(75) Inventors: Hyung-rae Lee, Hwaseong-si (KR); Yool Kang, Yongin-si (KR); Kyung-hwan Yoon, Yongin-si (KR); Hyoung-hee Kim, Hwaseong-si (KR); So-ra Han, Bucheon-si (KR); Tae-hoi Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 13/185,897

(22) Filed: Jul. 19, 2011

(65) Prior Publication Data

US 2012/0028434 A1 Feb. 2, 2012

(30) Foreign Application Priority Data

Jul. 27, 2010 (KR) ........................ 10-2010-0072484

(51) Int. Cl.
*H01L 21/76* (2006.01)

(52) U.S. Cl.
USPC ........................................ 438/400

(58) Field of Classification Search
USPC ........................................... 438/400
See application file for complete search history.

(56) References Cited

U.S. PATENT DOCUMENTS

| 6,991,893 | B2* | 1/2006 | Goodner et al. | 430/322 |
| 2003/0082912 | A1* | 5/2003 | Kezuka et al. | 438/689 |
| 2009/0104763 | A1* | 4/2009 | Ahn et al. | 438/593 |
| 2009/0214985 | A1 | 8/2009 | Kulp | |
| 2010/0317185 | A1* | 12/2010 | Vos et al. | |

FOREIGN PATENT DOCUMENTS

| KR | P1998-031853 | 7/1998 |
| KR | 1020060128325 | 12/2006 |

* cited by examiner

*Primary Examiner* — Shaun Campbell
(74) *Attorney, Agent, or Firm* — F. Chau & Associates, LLC

(57) ABSTRACT

A method of manufacturing a semiconductor device includes forming a resist pattern on a first region on a substrate, bringing a descum solution including an acid source into contact with the resist pattern and with a second region of the substrate, decomposing resist residues remaining on the second region of the substrate by using acid obtained from the acid source in the descum solution and removing the decomposed resist residues and the descum solution from the substrate.

5 Claims, 24 Drawing Sheets

METHOD OF MANUFACTURING SEMICONDUCTOR DEVICE USING ACID DIFFUSION

CROSS-REFERENCE TO RELATED APPLICATIONS

This application claims the benefit of Korean Patent Application No. 10-2010-0072484, filed on Jul. 27, 2010, the disclosure of which is hereby incorporated by reference herein in its entirety.

BACKGROUND

Exemplary embodiments of the inventive concept relate to a method of manufacturing a semiconductor device, and more particularly, to a method of manufacturing a semiconductor device including a process using an organic material.

As semiconductor devices become more highly integrated, the need for a micro-fabrication technology, such as for forming of a photoresist pattern, has grown. In a manufacturing process of a semiconductor device using photolithography, a photoresist layer may be formed on a layer to be patterned, and exposing and developing processes are then performed on the photoresist layer, thereby forming a photoresist pattern. At this time, residues such as scum may remain on an undesired part of a substrate after performing the exposing process, and thus the residues may frequently act as undesirable particles when a subsequent process is performed. In particular, when a highly scaled micro-sized device is formed, a negative influence due to residues such as scum may cause an undesirable result, and thus a method of effectively removing the residue may be required.

Thus, there is a need in the art for a method of manufacturing a semiconductor device, which effectively removes residues, such as scum, remaining on an undesired part of a substrate after undergoing exposing and developing processes for forming a resist pattern through a simple and low cost process without having a negative influence on shapes and performances of other components on the substrate.

SUMMARY

Exemplary embodiments of the inventive concept provide a method of manufacturing a semiconductor device, which effectively removes residues, such as scum, remaining on an undesired part of a substrate after undergoing exposing and developing processes for forming a resist pattern through a simple and low cost process without having a negative influence on shapes and performances of other components on the substrate.

According to an exemplary embodiment of the inventive concept, there is provided a method of manufacturing a semiconductor device, the method including: forming a resist pattern i on a first region on a substrate; bringing a descum solution including an acid source into contact with the resist pattern and with a second region of the substrate, decomposing resist residues remaining on the second region of the substrate by using acid obtained from the acid source in the descum solution and removing the decomposed resist residues and the descum solution from the substrate.

The descum solution may include the acid source, an organic compound, and a solvent.

The decomposing of the resist residues may include diffusing acid obtained from the acid source in the descum solution by applying heat to the descum solution.

The decomposed resist residues and the descum solution may be removed by performing a rinse process using at least one selected from the group consisting of deionized water and an alkali solution.

A base layer is disposed on the first region and the second region of the substrate. A part of the base layer is covered by the resist pattern in the first region, and a surface of the base layer in the second region is exposed by the resist pattern and contacts the descum solution when the descum solution is brought into contact with the resist pattern and the second region of the substrate, and the method may further include removing the base layer exposed in the second region by using the resist pattern as an etching mask after the descum solution is removed from the substrate.

The base layer may be removed by using a wet etching process. The base layer may include a target layer formed of an insulating material or a conductive material and a protection layer covering the target layer, and the removing of the base layer may include sequentially performing a wet etching process on the protection layer and the target layer.

According to an exemplary embodiment of the inventive concept, there is provided a method of manufacturing a semiconductor device, the method including: forming a base layer on a substrate, forming a resist pattern on the base layer, thereby exposing a part of the base layer, bringing a descum solution including a water soluble polymer and a solvent into contact with the exposed part of the base layer, applying heat to the descum solution and removing the descum solution from the substrate.

The water soluble polymer may include a repeating unit having a substituent comprised of a heterocyclic compound having nitride atoms.

Acid remaining on a surface of the resist pattern may be diffused in the descum solution due to the heat applied to the descum solution.

The descum solution may further include one of an acid source comprised of acid or potential acid. The descum solution may include a water soluble polymer including a copolymer of pyrrolidone and an imidazole, a thermal acid generator (TAG), and deionized water. Acid may be generated from the TAG by the heat applied to the descum solution, and the acid generated from the TAG may be diffused in the descum solution.

The descum solution may be removed from the substrate by performing a rinse process using any one selected from the group consisting of deionized water and tetramethylammonium hydroxide (TMAH), or a combination thereof.

According to an exemplary embodiment of the inventive concept, there is provided a method of manufacturing a semiconductor device, the method including: forming a polymer material pattern covering a part of a substrate on the substrate, bringing a descum solution including a water soluble polymer, an acid source, and a solvent into contact with a surface of the substrate and the polymer material pattern, diffusing acid obtained from the acid source in the descum solution and removing the descum solution from the surface of the substrate and the polymer material pattern.

According to an exemplary embodiment of the inventive concept, there is provided a method of manufacturing a semiconductor device, the method including: forming a device isolation layer in a substrate to divide the substrate into a first region and a second region and to define a plurality of active regions in the substrate, forming a plurality of sacrificial layer patterns on the first region and the second region of the substrate, respectively, forming a plurality of insulating spacers on a sidewall of the sacrificial layer patterns in the first region and the second region, filling an insulating layer between spaces defined by the insulating spacers between the sacrificial layer patterns, removing the sacrificial layer patterns from the first region and the second region, so that the active regions of the substrate are exposed through a first space in the first region and a second space in the second region, respectively formed between an adjacent two of the insulating spacers, conformally forming a gate insulating layer to cover exposed surfaces of the first space in the first region and the second space in the second region, forming a first metal stack layer on the gate insulating layer in the first region and the second region, forming a p-type metal-oxide semiconductor (PMOS) work function metal layer on the first metal stack in the first region and the second region, forming a protective layer covering substantially an entire upper surface of the PMOS work function layer in the first region and the second region, forming a resist pattern covering the protective layer in the second region and exposing a surface of the protection layer in the first region, bringing a descum solution into contact with the exposed surface of the protection layer in the first region and with the resist pattern, wherein the descum solution includes a water soluble polymer and a solvent, performing a baking process on the descum solution, removing the descum solution from the resist pattern and the exposed surface of the protection layer, and removing the protection layer exposed in the first region by using the resist pattern as an etching mask.

The method further includes removing the resist pattern in the second region, removing the PMOS work function metal layer in the first region using the protection layer remaining in the second region as an etching mask, removing the protection layer remaining in the second region, forming a second metal stack layer constituting an n-type metal-oxide semiconductor (NMOS) work function metal layer on the first region and the second region, sequentially forming a third metal stack layer and a capping layer on the second metal stack layer in the first region and the second region and performing a planarization process on the capping layer until an upper surface of the insulating layer is exposed in the first region and the second region, such that a first gate stacked structure is formed which remains in the first space in the first region and a second gate stacked structure is formed which remains in the second space in the second region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

Figure 1A:
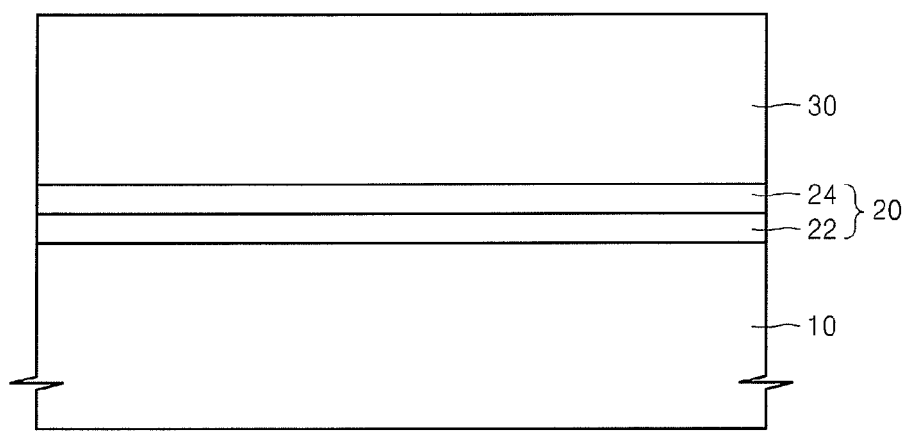
FIGS. 1A through 1F are cross-sectional views for explaining a method of manufacturing a semiconductor device, according to an exemplary embodiment of the inventive concept.

Exemplary embodiments of the inventive concept will now be described more fully with reference to the accompanying drawings. The exemplary embodiments may, however, be embodied in many different forms and should not be construed as being limited to embodiments set forth herein. In the drawings, the thicknesses of layers and regions are exaggerated for clarity. Like reference numerals in the drawings denote like elements.

FIGS. 1A through 1F are cross-sectional views for explaining a method of manufacturing a semiconductor device, according to an exemplary embodiment of the inventive concept.

Referring to FIG. 1A, a resist layer 30 is formed on a base layer 20 on a substrate 10.

The substrate 10 may be, for example, a silicon substrate.

The base layer 20 may be configured as a single-layer structure or a multi-layered structure in which two or more different material layers are sequentially stacked. In the current embodiment, the base layer 20 includes, for example, a target layer 22 and a protection layer 24 for protecting the target layer 22. The target layer 22 may be formed of various materials according to the purpose of a pattern to be formed. When an electrode is formed on the substrate 10, the target layer 22 may be formed of, for example, one selected from the group consisting of a metal, a metal nitride, an alloy, a doped polysilicon layer, a metal silicide layer, or a combination thereof. Alternatively, the target layer 22 may be formed of a dielectric layer or an insulating layer such as, for example, silicon nitride or silicon oxide. The protection layer 24 may be formed so as to completely cover the target layer 22 to prevent the target layer 22 from being damaged while undergoing a subsequent process. The protection layer 24 may be formed of an insulating layer such as, for example, a silicon oxide layer. The protection layer 24 may be omitted within the scope of exemplary embodiments of the inventive concept.

The resist layer 30 may be formed of, for example, a conventional resist composition. For example, the resist layer 30 may be formed of a positive chemically amplified resist composition including a photoacid generator (PAG). Alternatively, the resist layer 30 may be obtained from, for example, a resist composition for a KrF excimer laser (248 nm), a resist composition for an ArF excimer laser (193 nm), or a resist composition for a $F_2$ excimer laser (157 nm). An anti-reflection layer (not shown) may further be formed between the base layer 20 and the resist layer 30 when required. The anti-reflection layer may be formed of, for example, an organic or inorganic material.

Figure 1B:
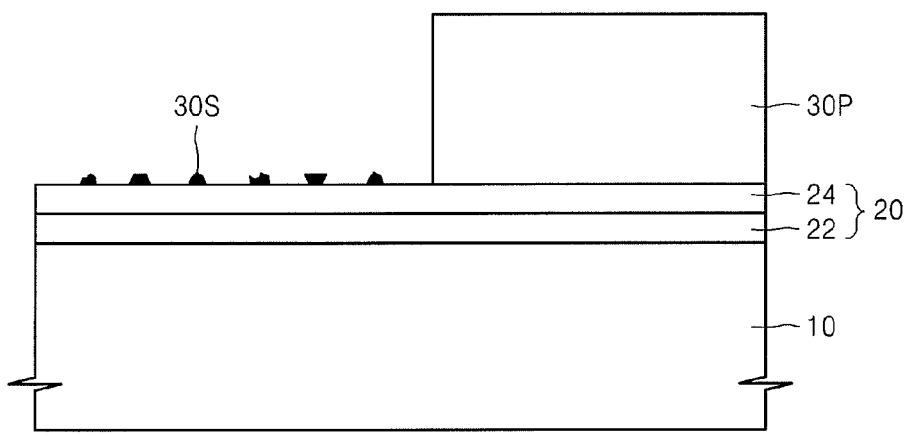

Referring to FIG. 1B, a resist pattern 30P is formed by exposing a portion of the resist layer 30 and developing the exposed resist layer 30. At this time, a plurality of residues 30S of the resist layer 30, such as, for example, scum, may remain on a surface of the exposed base layer 20 around the resist pattern 30P after developing the resist layer 30. The residues 30S remaining on the surface of the base layer 20 may have a negative influence on an etching process of the base layer 20 in a subsequent process.

Figure 1C:
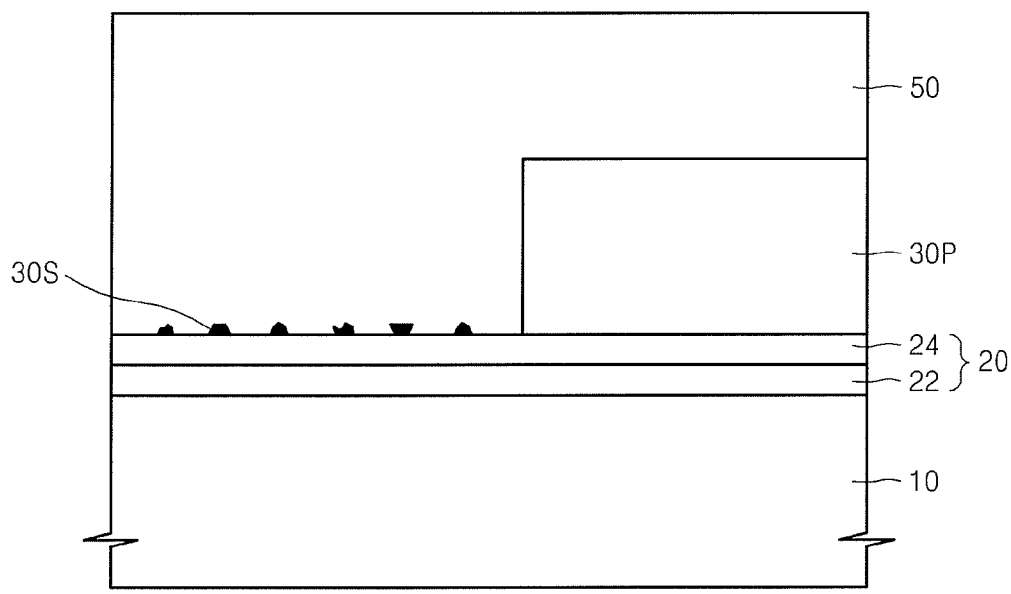

Referring to FIG. 1C, the exposed base layer 20 contacts a descum solution 50 including, for example, an organic compound and an acid source, and acid obtained from the acid source reacts with the residues 30S.

Protecting groups of a polymer constituting the residues 30S are deprotected due to the acid, and consequently, the residues 30S are decomposed and are thus separated from the surface of the base layer 20.

The descum solution 50 may contact the surface of the base layer 20 by using any one of various methods. For example, the descum solution 50 is spin-coated on an upper front surface of the substrate in which the resist patterns 30P are formed by using, for example, a pre-wetting process and a spraying process using a stream nozzle. Alternatively, the descum solution 50 may be coated on the entire exposed surface of the base layer 20 and the resist patterns 30P by using, for example, a spray nozzle included in a linear driving type spray apparatus. Alternatively, the descum solution 50 may be sprayed on the substrate 10 by using, for example, a spray nozzle including a shower head.

The descum solution 50 may include, for example, the organic compound, the acid source, and a solvent.

The organic compound that may be included in the descum solution 50 may include, for example, a water soluble polymer. Alternatively, the organic compound may include, for example, a heterocyclic compound having a nitrogen atom or include a polymer having a heterocyclic substituent including a nitrogen atom. For example, the descum solution 50 may include a water soluble polymer including at least one repeating unit selected from a pyrrolidone-based first repeating unit and an imidazole-based second repeating unit.

Alternatively, the water soluble polymer included in the descum solution 50 may be composed of, for example, a copolymer including a pyrrolidone-based first repeating unit and a second repeating unit having a structure different from that of the first repeating unit. The second repeating unit may include, for example, at least one repeating unit derived from a monomer selected from the group consisting of an acrylamide type monomer, a vinyl type monomer, an alkylene glycol type monomer, a maleic anhydride monomer, an ethylene imine monomer, a monomer including an oxazoline group, an acrylonitrile monomer, an allylamide monomer, a 3,4-dihydropyran monomer, and a 2,3-dihydrofuran monomer.

Alternatively, the water soluble polymer included in the descum solution 50 may be composed of, for example, a terpolymer including a pyrrolidone-based first repeating unit, an imidazole-based second repeating unit, and a third repeating unit having a structure different from those of the first and the second repeating units. The third repeating unit may include, for example, at least one repeating unit derived from a monomer selected from the group consisting of an acrylamide type monomer, a vinyl type monomer, an alkylene glycol type monomer, a maleic anhydride monomer, an ethylene imine monomer, a monomer including an oxazoline group, an acrylonitrile monomer, an allylamide monomer, a 3,4-dihydropyran monomer, and a 2,3-dihydrofuran monomer.

The acid source that may be included in the descum solution 50 may be composed of, for example, a potential acid consisting of at least one selected from the group consisting of a thermal acid generator (TAG) and a photoacid generator (PAG), or may be composed of an acid. The type of the acid is not limited, and various types of acids may be used. For example, sulfonic acids such as paratoluenesulfonic acid (PTSA) or $CH_3SO_3H$ may be used. For example, when the descum solution 50 includes a sulfonic acid, a —H group of the sulfonic acid may be substituted with a C1-C10 alkyl group.

Alternatively, the acid source that may be included in the descum solution 50 may be, for example, at least one selected from the group consisting of perfluorobutane sulfonic acid ($C_4F_9SO_3H$), trifluoroacetic acid ($CF_3CO_2H$), and trifluoromethanesulfonic acid ($CF_3SO_3H$).

Alternatively, the acid source that may be included in the descum solution 50 may be, for example, a PAG that generates acid when exposed to any one light from a KrF excimer laser (248 nm), an ArF excimer laser (193 nm), or an $F_2$ excimer laser (157 nm). The PAG may be composed of, for example, any one selected from the group consisting of triarylsulfonium salts, diaryliodonium salts, sulfonates, and a mixture thereof. For example, the PAG may be composed of any one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, PFOS (triphenylsulfonium perfluorooctanesulfonate), diphenyliodonium PFOS, methoxydiphenyliodonium PFOS, di-t-butyldiphenyliodonium triflate, N-hydroxysuccinimide PFOS, norbornene-dicarboximide PFOS, and a mixture thereof.

Alternatively, the acid source that may be included in the descum solution 50 may be, for example, a TAG that generates acid by heat. The TAG may consist of, for example, an aliphatic or alicyclic compound. For example, the TAG may be composed of at least one compound selected from the group consisting of carbonate ester, sulfonate ester, phosphate ester and a mixture thereof. In detail, the TAG may be composed of at least one compound selected from the group consisting of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, adamantyl nonafluorobutanephosphonate and a mixture thereof.

The solvent that may be included in the descum solution 50 may be composed of, for example, any one of deionized water, an organic solvent, and a combination thereof. The organic solvent may be composed of, for example, isopropyl alcohol (IPA), pentanol, propylene glycol methyl ether acetate (PGMEA), ethyl lactate (EL), cyclohexanone, or a combination thereof.

The descum solution 50 may be a composition including, for example, a water soluble polymer including a heterocyclic compound having a nitrogen atom, an acid source, and a deionized water. For example, when the descum solution 50 includes a TAG as the acid source, the descum solution 50 is coated on the base layer 20 and is then baked for about 20 seconds to about 180 seconds at a temperature of about 25° C. to about 180° C., thereby generating acid from the TAG.

Alternatively, the descum solution 50 may be a composition including, for example, R-607, which is a kind of RELACS™ (Resolution Enhancement Lithography Assisted by Chemical Shrink: a product of AZ Electronic Materials), an acid source, and deionized water. In this case, for example, the descum solution 50 may be coated on the base layer 20 and then may be baked for about 20 seconds to about 70 seconds at a temperature of about 100° C. to about 150° C.

In the descum solution 50, polymer content may be determined within a range of, for example, about 1 wt % to about 50 wt % on the basis of the total weight of the descum solution 50. In addition, in the descum solution 50, acid source content may be determined within a range of, for example, about 1 wt % to about 20 wt % on the basis of the total weight of the descum solution 50. Further, in the descum solution 50, the solvent content may be determined within a range of, for example, about 30 wt % to about 98 wt % on the basis of the total weight of the descum solution 50.

As described above with reference to FIG. 1C, after bringing the exposed base layer 20 into contact with the descum solution 50, to facilitate diffusion of the acid in the descum solution 50 and to promote reaction between the acid and the residues 30S, a baking process for applying heat to a resultant in which the descum solution is coated on the substrate 10 may be added. At this time, the baking process may be performed, for example, at a temperature of about 100° C. to about 150° C. for about 20 seconds to about 70 seconds.

Alternatively, the descum solution 50 may not include an acid source such as an acid or a potential acid within the scope of exemplary embodiments of the inventive concept. For example, when a positive chemically amplified resist composition is used when forming the resist pattern 30P, acid may remain on an external surface of the resist pattern 30P. As such, when the descum solution 50 covering the resist pattern 30P and the exposed portion of the base layer 20 is baked with the acid remaining on the surface of the resist pattern 30P, the acid remaining on the surface of the resist pattern 30P diffuses to the residue 30S in the descum solution 50 and reacts with the residues 30S, thereby decomposing the residues 30S. Diffusion of the acid remaining on the surface of the resist pattern 30P into the descum solution 50 may be promoted by the baking process as described above with reference to FIG. 1C.

As described above, the exposed base layer 20 contacts the descum solution 50, and thus the acid reacts with the residues 30S. As a result, the residues 30S are decomposed and thus are separated from the surface of the base layer, and the residues 30S remain in the descum solution 50.

Figure 1D:
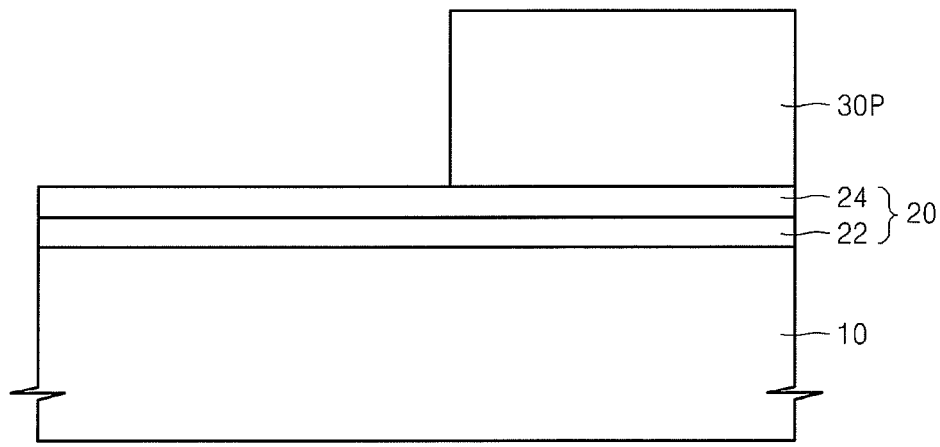

Referring to FIG. 1D, the descum solution 50 is removed with the residues 30S decomposed by the reaction with the acid. While the descum solution 50 is removed, the decomposed residues 30S may also be removed.

For example, remove the descum solution 50, a rinsing process may be performed on a resultant in which the descum solution 50 remains on the substrate 10 by using any one selected from the group consisting of deionized water and alkali solution, or a combination thereof until the descum solution 50 and the decomposed residues 30S are completely removed. The alkali solution may include, for example, tetramethylammonium hydroxide (TMAH) of 2.38% in weight.

Figure 1E:
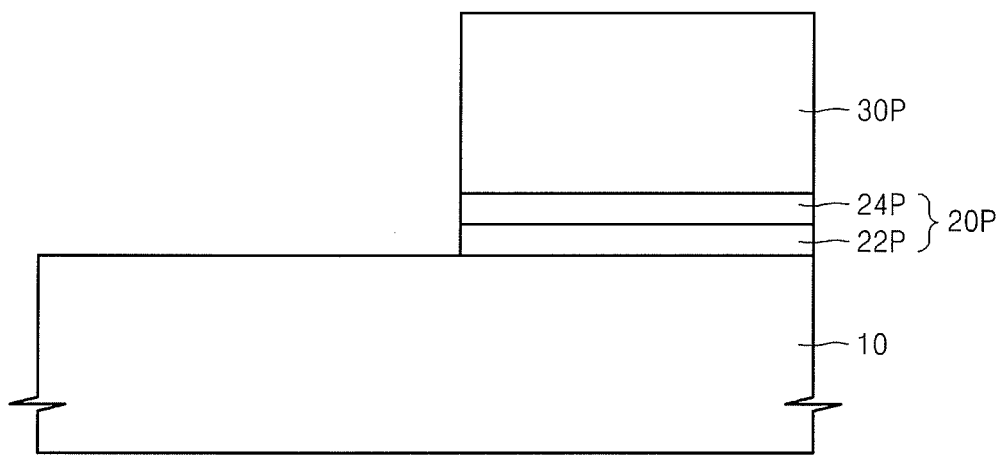

Referring to FIG. 1E, the exposed portions of the protection layer 24 and the target layer 22 constituting the base layer 20 are sequentially etched by using the resist pattern 30P as an etching mask, thereby forming a base pattern 20P composed of a target layer pattern 22P and a protection layer pattern 24P.

Figure 1F:
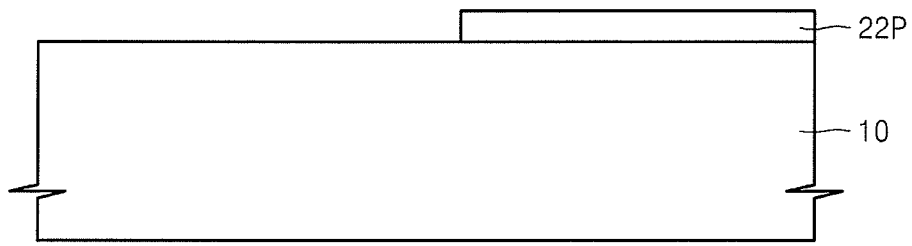

Referring to FIG. 1F, the resist pattern 30P is removed so as to expose an upper surface of the protection layer pattern 24P, and then the protection layer pattern 24P is removed so as to expose an upper surface of the target layer pattern 22P.

In the above embodiment described with reference to FIGS. 1A through 1F, a wet process using a descum solution is performed to remove resist residues such as, for example, scum. Accordingly, there is no need to use expensive and large-sized equipment commonly used in a process for removing resist residues such as scum by oxygen plasma or ultra violet (UV) irradiation. Further, the resist residues are effectively removed by using a relatively simple wet process without causing an undesirable deformation of the resist pattern.

FIGS. 2A through 2K are cross-sectional views for explaining a method of manufacturing a semiconductor device, according to an embodiment of the inventive concept.

FIGS. 2A through 2K illustrate, a method of manufacturing a semiconductor device according to exemplary embodiments of the inventive concept which is applied to a logic complementary metal-oxide semiconductor (CMOS) fabrication, in particular, to a process for forming a metal gate electrode of a logic CMOS.

Figure 2A:
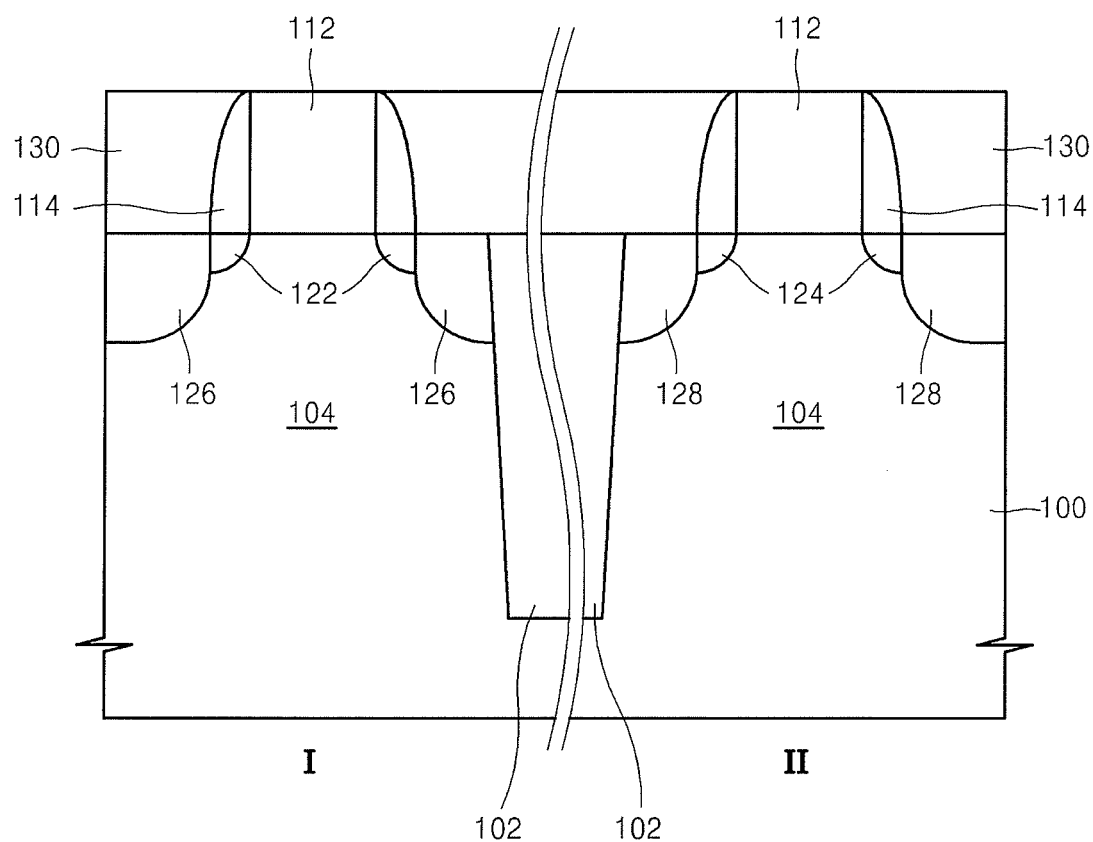
FIGS. 2A through 2K are cross-sectional views for explaining a method of manufacturing a semiconductor device, according to an exemplary embodiment of the inventive concept.

Referring to FIG. 2A, a device isolation layer 102 is formed in a substrate 100 having a first region I and a second region II so as to define a plurality of active regions 104, and then a plurality of sacrificial layer patterns 112 are respectively formed in the first region I and the second region II of the substrate 100.

The first region I and the second region II may be divided by the device isolation layer 102. In the present embodiment, the first region I may be, for example, an n-type metal-oxide semiconductor (NMOS) region, and the second region II may be, for example, a p-type metal-oxide semiconductor (PMOS) region. For example, substrate 100 may be formed of silicon, and the device isolation layer 102 may be formed of any one selected from the group consisting of an oxide layer, a nitride layer, and a combination thereof. The sacrificial layer pattern 112 may be formed of, for example, polysilicon.

A plurality of insulating spacer 114 are formed along both side walls of each of the sacrificial layer patterns 112. The insulating spacers 114 may be formed of, for example, any one selected from the group consisting of an oxide layer, a nitride layer, and a combination thereof.

For example, before the plurality of the insulating spacers 114 are formed, an ion implantation process may be performed to form a plurality of lightly doped drain (LDD) regions 122 and 124 in the respective active regions 104 of the first region I and the second region II of the substrate 100 by using the sacrificial layer patterns 112 as ion implantation masks. After the insulating spacers 114 are formed, the ion implantation process is performed on the active regions 104 of the first region I and the second region II of the substrate 100 by using, for example, the sacrificial layer patterns 112 and the insulating spacers 114 as ion implantation masks, and then an annealing process may be performed to form a plurality of source regions 126 and a plurality of drain regions 128 in the respective active regions 104 of the substrate 100.

In the first region I of the substrate 100, for example, an n-type dopant may be ion-implanted to form the n-type LDD region 122 and the n-type source/drain regions 126. In the second region II of the substrate 100, for example, a p-type dopant may be ion-implanted i to form the p-type LDD region 124 and the p-type source/drain regions 128.

Then, an insulating layer 130 is filled in each of a plurality of spaces defined by the insulating spacers 114 between the sacrificial layer patterns 112.

The insulating layer 130 may include, for example, a silicon oxide or a material having a low dielectric constant. To form the insulating layer 130, an insulating material is deposited on the substrate 100 so as to have a thickness sufficient to fill the spaces defined by the insulating spacers 114 between the sacrificial layer patterns 112, and then a planarization process such as, for example, chemical mechanical polishing (CMP) may be performed thereon until upper surfaces of the sacrificial layer patterns 112 are exposed.

Figure 2B:
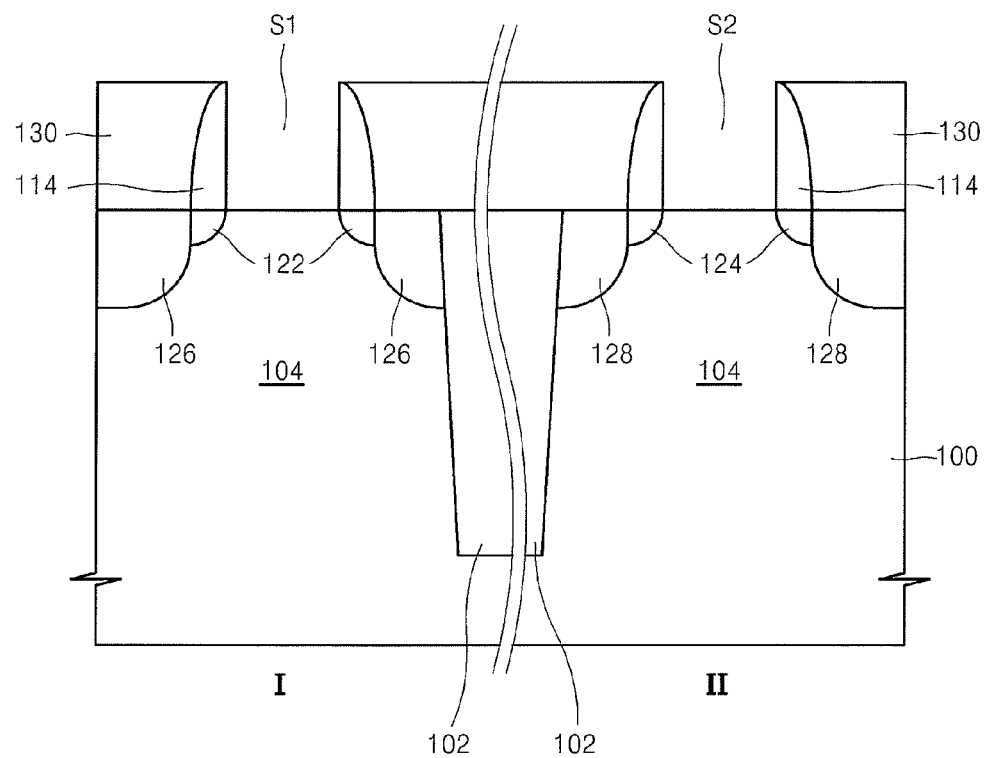

Referring to FIG. 2B, the sacrificial layer patterns 112 are removed in the first region I and the second region II, so that the active regions 104 of the substrate 100 are exposed through a first space S1 and a second space S2 respectively formed between the adjacent two insulating spacers 114.

The sacrificial layer patterns 112 may be removed by using, for example, a wet etching process.

Figure 2C:
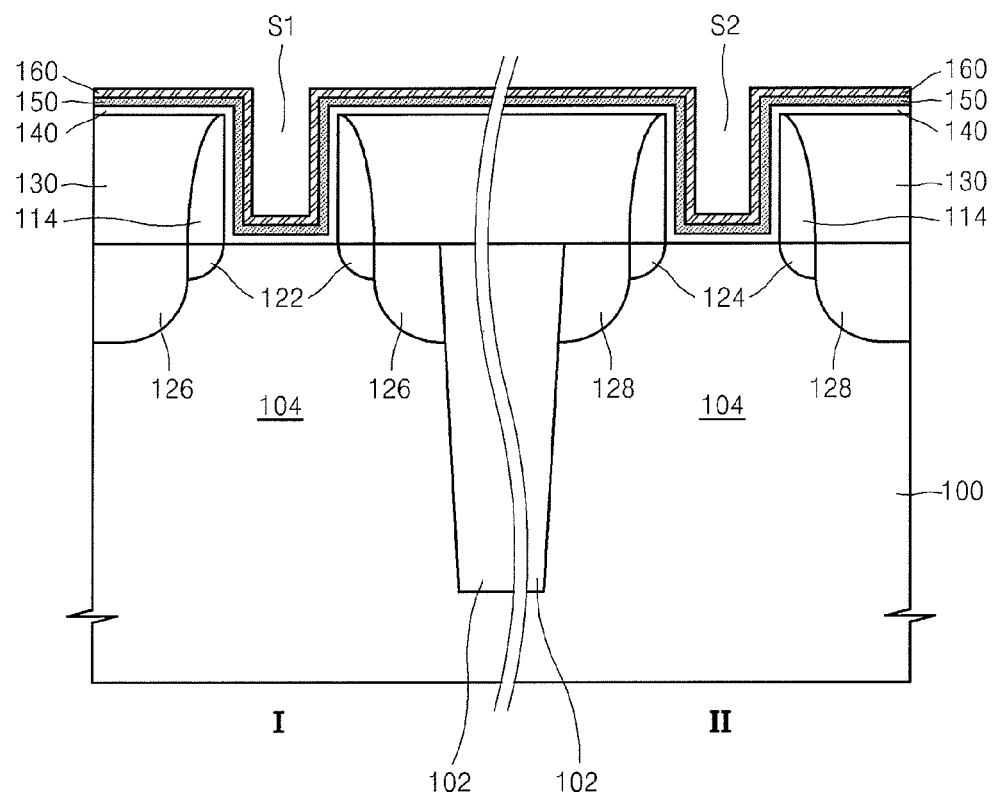

Referring to FIG. 2C, a gate insulating layer 140 is formed to conformally cover exposed surfaces of the first space S1 and the second space S2 in the first region I and the second region II. A first metal stack layer 150 is formed on the gate insulating layer 140, and a PMOS work function metal layer 160 is formed on the first metal stack layer 150.

For example, the gate insulating layer 140 may have a structure in which a silicon oxide layer and a high dielectric layer are stacked. The high dielectric layer may be formed of, for example, a hafnium oxide (HfO$_2$) layer doped with zirconium (Zr).

For example, the first metal stack layer 150 may have a structure in which a titanium nitride (TiN) layer and a metal layer based on tantalum (Ta) are sequentially stacked. In this regard, the metal layer based on Ta may be formed of tantalum nitride (TaN).

The PMOS work function metal layer 160 may be formed of, for example, a TiN layer. The PMOS work function metal layer 160 is required only in the second region II which is a PMOS region, and thus the PMOS work function metal layer 160 formed in the first region I may need to be removed.

Figure 2D:
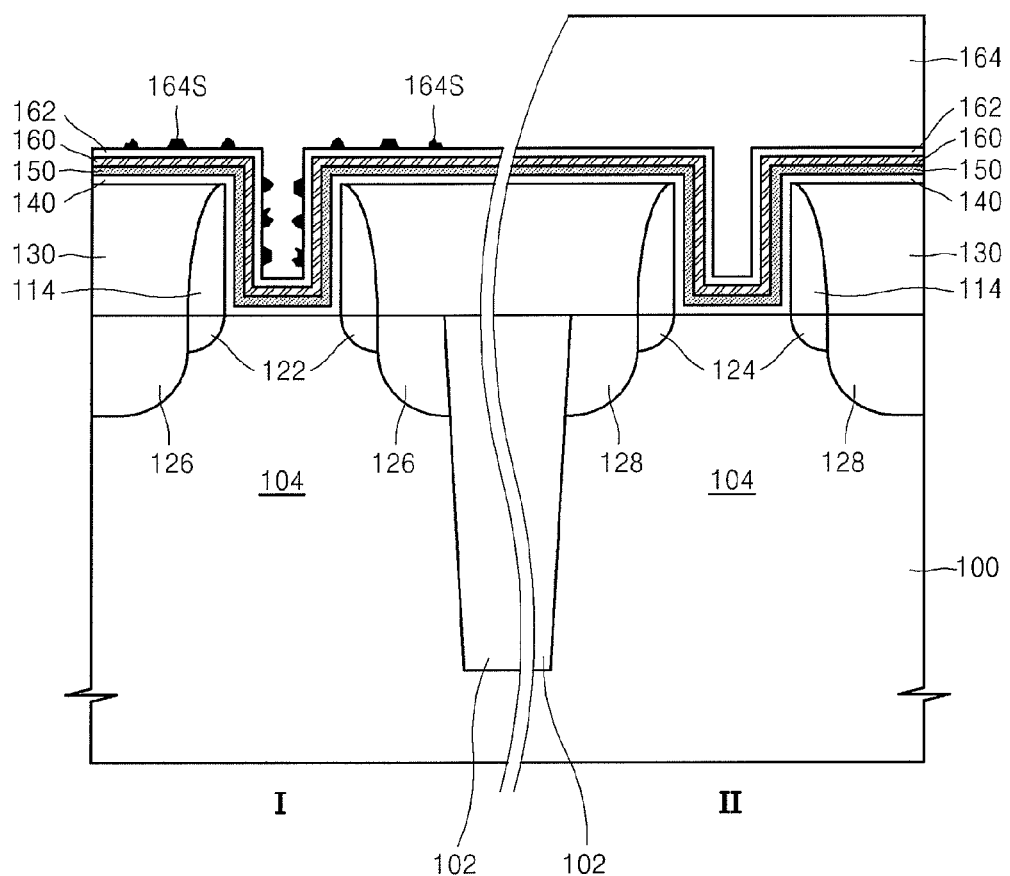

Referring to FIG. 2D, i to selectively remove a portion of the PMOS work function metal layer 160 in the first region I, a resist pattern 164 covering the PMOS work function metal layer 160 is formed in the second region II.

At this time, to protect the PMOS work function metal layer 160 in the second region II, a protection layer 162 covering the entire upper surface of the PMOS work function metal layer 160 may be formed before forming the resist pattern 164, and the resist pattern 164 may be formed on the protection layer 162. The protection layer 162 may be formed of, for example, a silicon oxide layer.

After the resist pattern 164 is formed, a plurality of resist residues 164S such as, for example, scum may remain on a surface of the protection layer 162 in the first region I. The residues 164S remaining on the protection layer 162 may have a negative influence on an etching process of the PMOS work function metal layer 160 to be performed later.

Figure 2E:
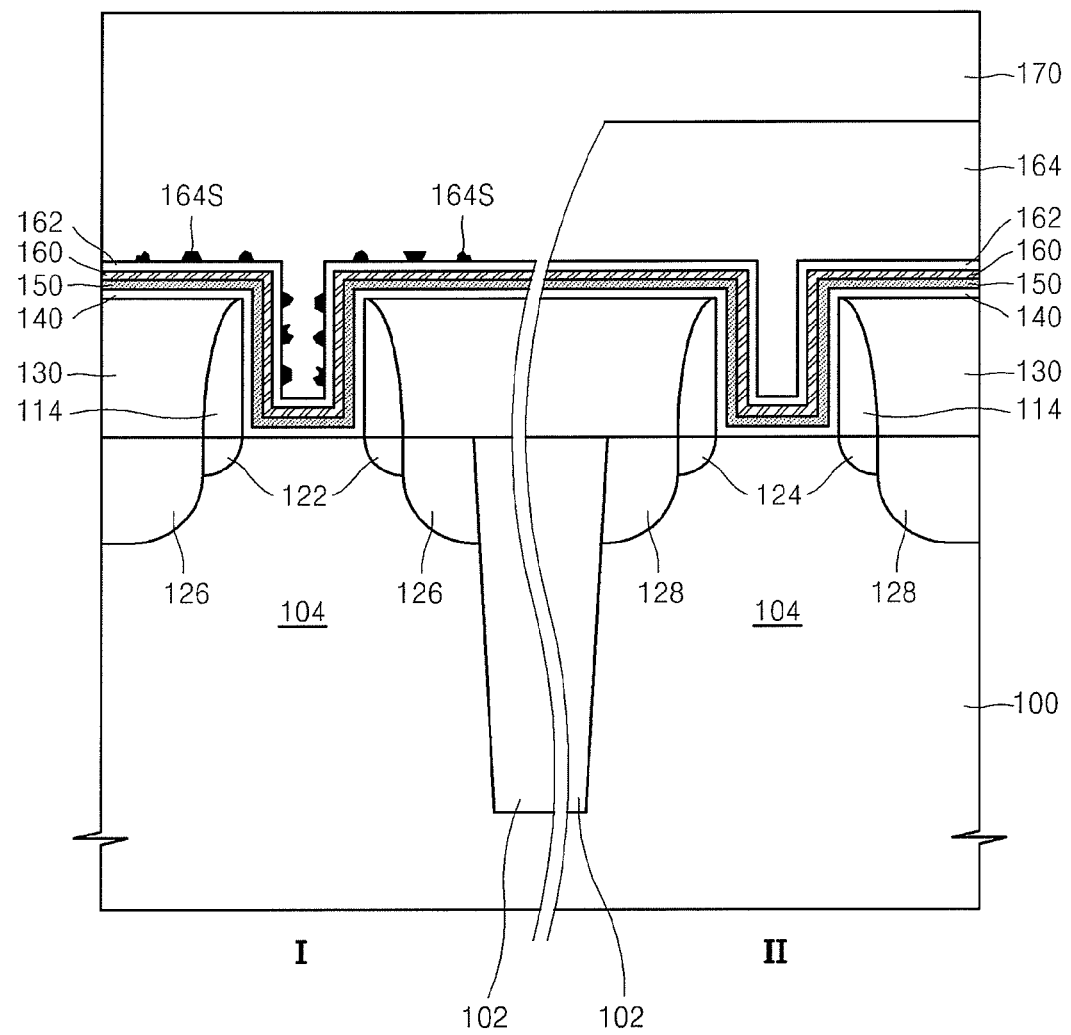

Referring to FIG. 2E, the surface of the protection layer 162 exposed in the first region I may come in contact with a descum solution 170 when the method described above with reference to FIG. 1C is performed.

To bring the surface of the protection layer 162 into contact with the descum solution 170, the descum solution 170 may be, for example, spin-coated on a resultant in which the resist pattern 164 is formed.

Details about the descum solution 170 are the same as those about the descum solution 50 described above with reference to FIG. 1C. After the descum solution 170 is coated on the resultant in which the resist pattern 164 is formed, a baking process is performed according to the conditions described above with reference to FIG. 1C, and thus acid obtained from an acid source included in the descum solution 170 is forced to diffuse, thereby decomposing the residues 164S.

In the current embodiment, since a wet process using the descum solution 170 is used to remove the residues 164S, even if a space remaining after forming the protection layer 162 in the first space S1 in the first region I is small, the residues 164S existing in the first space S1 may sufficiently contact the descum solution 170. Accordingly, the acid included in the descum solution 170 reaches each of the residues 164S existing in the first space S1 due to the diffusion of the descum solution 170, thereby effectively decomposing the residues 164S.

Figure 2F:
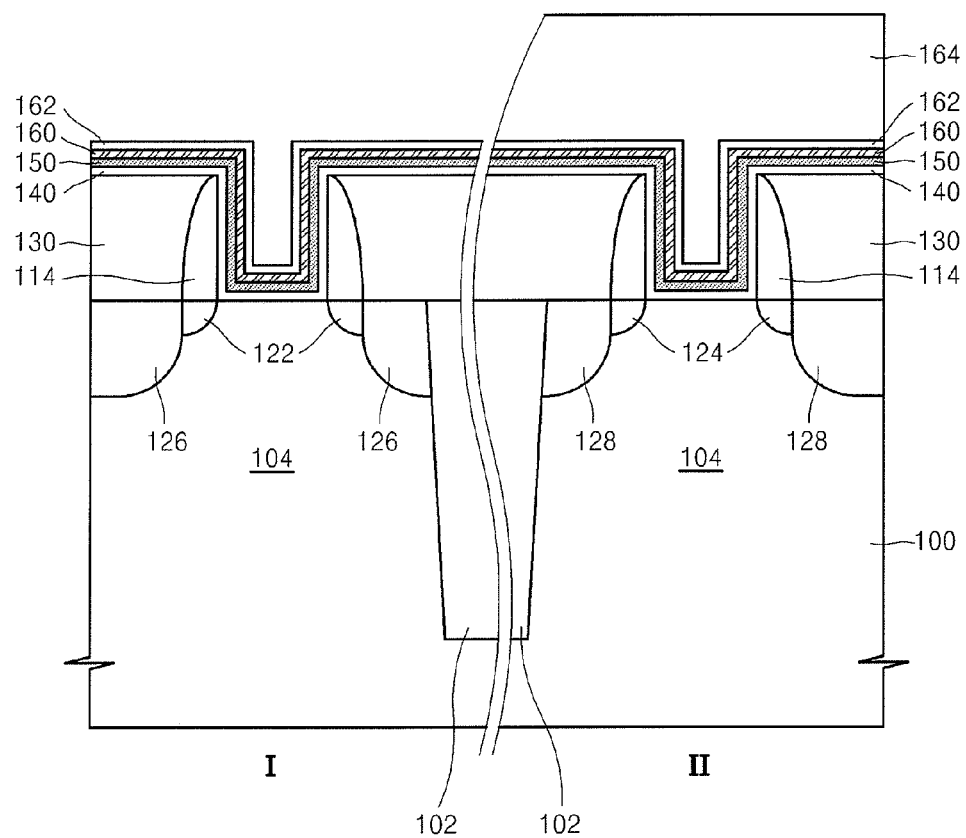

Referring to FIG. 2F, the descum solution 170 is removed by using the method described above with reference to FIG. 1D with the residues 164S decomposed by the reaction with the acid included in the descum solution 170. The residues 164S decomposed during the removal of the descum solution 170 are also removed, and thus the surface of the protection layer 162 may be completely exposed in a clean state in the first region I.

To remove the descum solution 170, the resultant on which the descum solution 170 remains on the substrate 100 may be rinsed by using, for example, any one selected from the group consisting of deionized water, an alkali solution, and a combination thereof until the descum solution 170 and the decomposed residues 164S are completely removed.

Figure 2G:
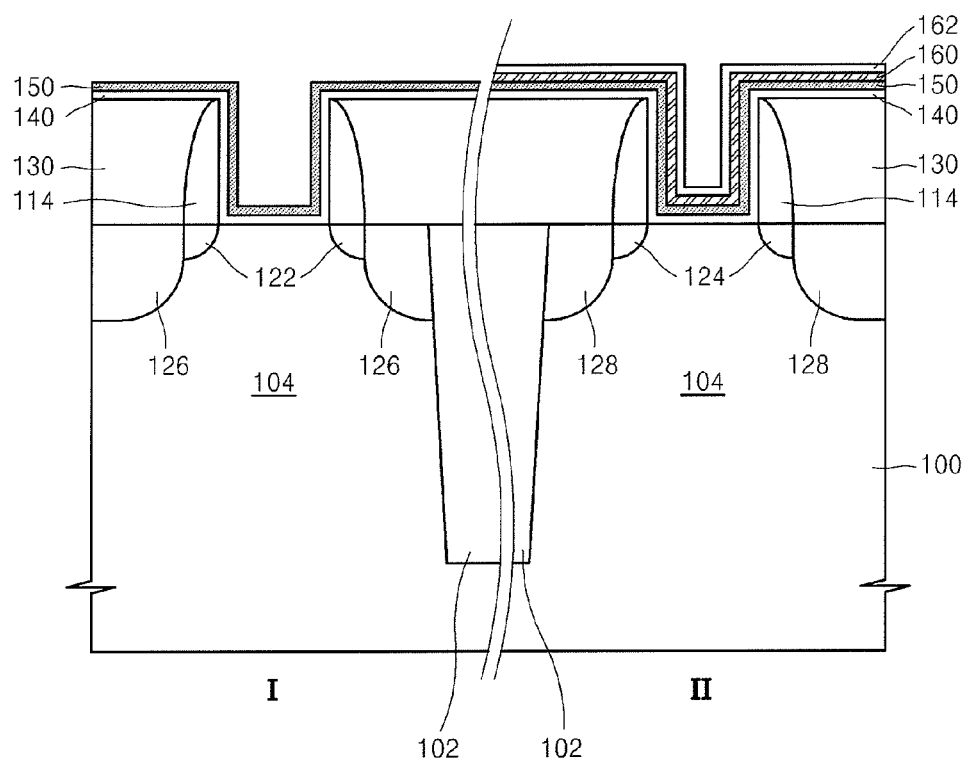

Referring to FIG. 2G, the protection layer 162 exposed in the first region I may be removed by using, for example, the resist pattern 164 as an etching mask. Then, the resist pattern 164 remaining in the second region II is removed, and the PMOS work function metal layer 160 formed in the first region I is removed by, for example, using the protection layer 162 remaining in the second region II as an etching mask.

The protection layer 162 and the PMOS work function metal layer 160 may be removed by using, for example, a wet etching process. As such, when the protection layer 162 and the PMOS work function metal layer 160 are removed by using a wet etching process, difficulties, such as damage to a lower structure or deformation, e.g. lifting of the resist pattern 164 that may occur when using a dry etching process, such as, for example, a plasma etching process are prevented. When the protection layer 162 is formed of a silicon oxide layer, a wet etching process using, for example, an hydrogen fluoride (HF) solution may be used to remove the protection layer 162. In addition, when the PMOS work function metal layer 160 is formed of TiN, a wet etching process using, for example, an etching solution including hydrogen peroxide (H$_2$O$_2$) may be used to remove the PMOS work function metal layer 160.

Since the protection layer 162 and the PMOS work function metal layer 160 formed under the protection layer 162 are removed in the first region I and the resist pattern 164 is removed in the second region II, an upper surface of the first metal stack layer 150 is exposed in the first region I and an upper surface of the protection layer 162 is exposed in the second region II.

Figure 2H:
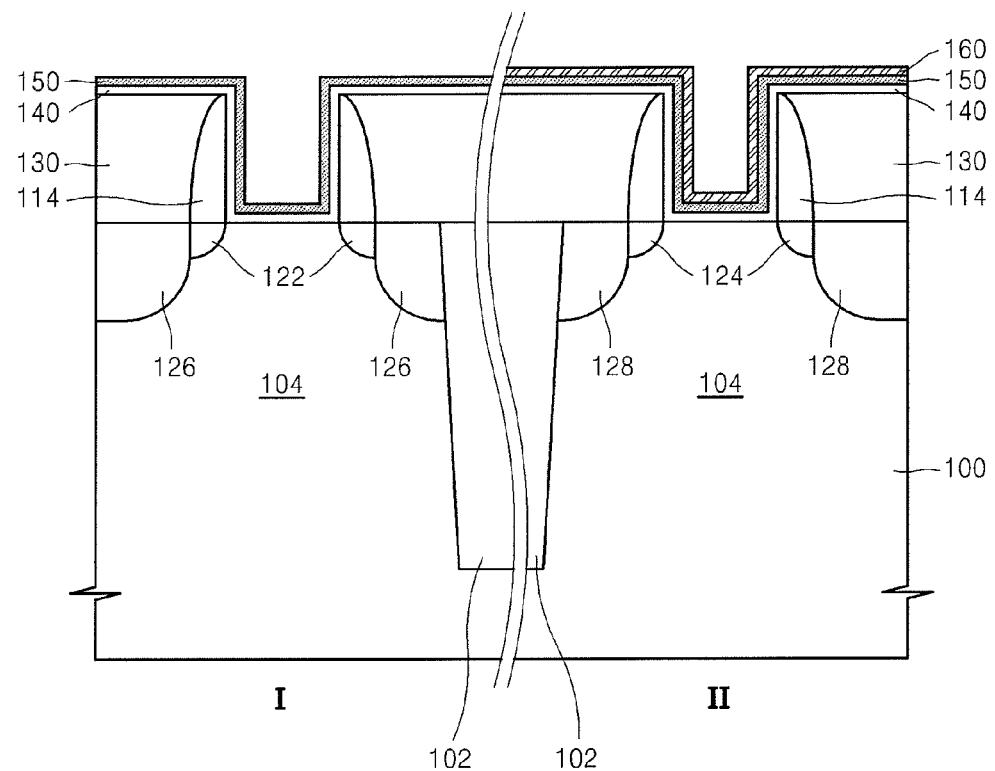

Referring to FIG. 2H, the protection layer 162 remaining in the second region II is removed so as to expose an upper surface of the PMOS work function metal layer 160 in the second region II.

Figure 2I:
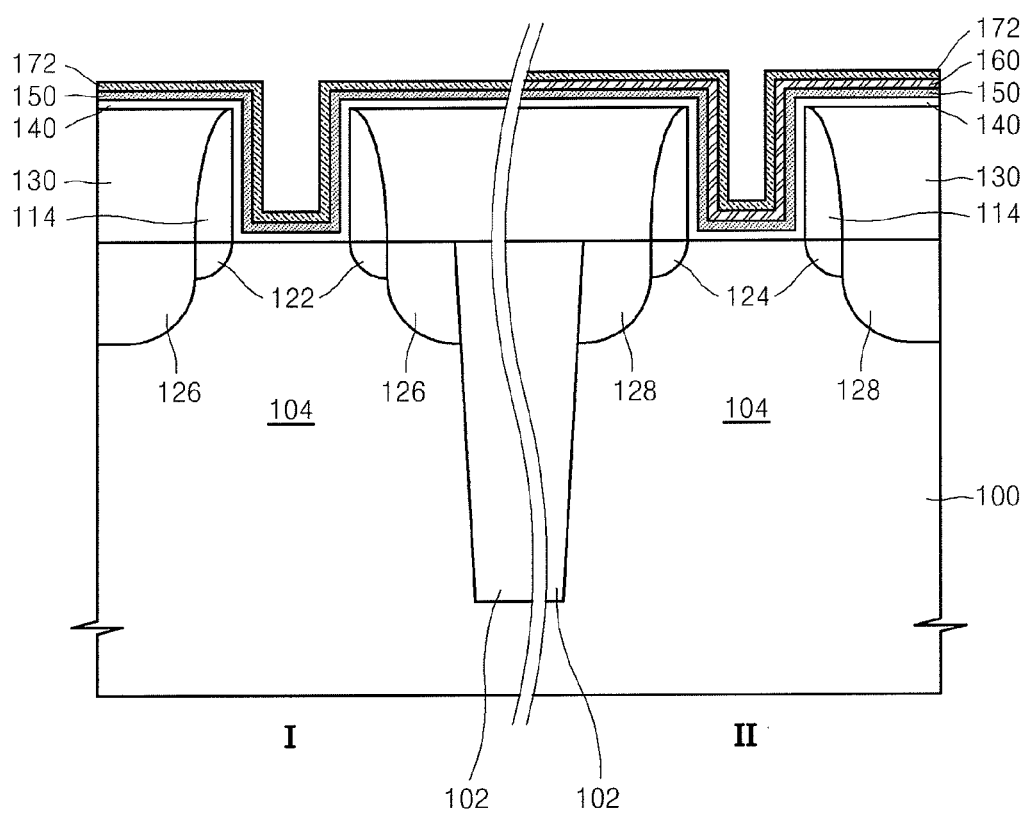

Referring to FIG. 2I, a plurality of second metal stack layers 172 are respectively formed in the first region I and the second region II.

The second metal stack layers 172 may constitute an NMOS work function metal layer. For example, the second metal stack layer 172 may be formed of a titanium aluminum (TiAl) layer.

Figure 2J:
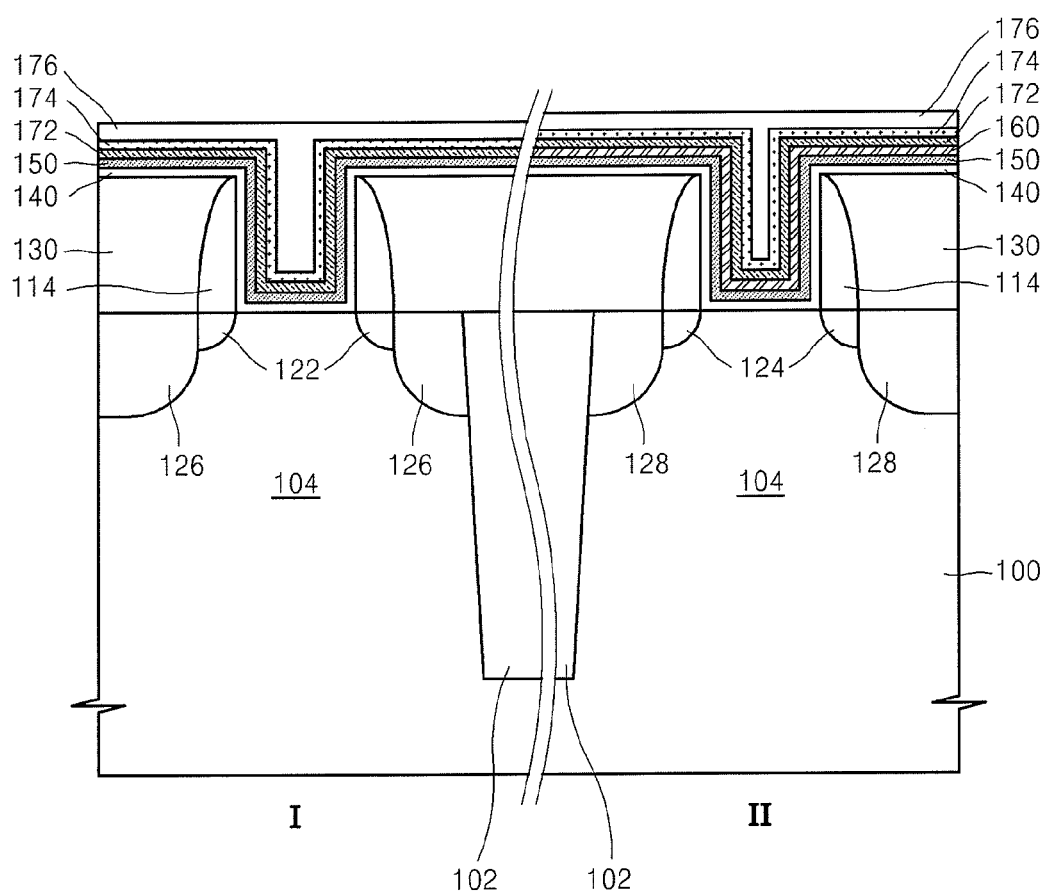

Referring to FIG. 2J, a third metal stack layer 174 and a capping layer 176 may be sequentially formed on the second metal stack layer 172.

The third metal stack layer 174 may have a structure in which, for example, a TiN layer, a TiAl layer, and a TiAl layer are sequentially stacked. The capping layer 176 may be formed of, for example, an aluminum titanium oxide (AlTiO) layer.

Figure 2K:
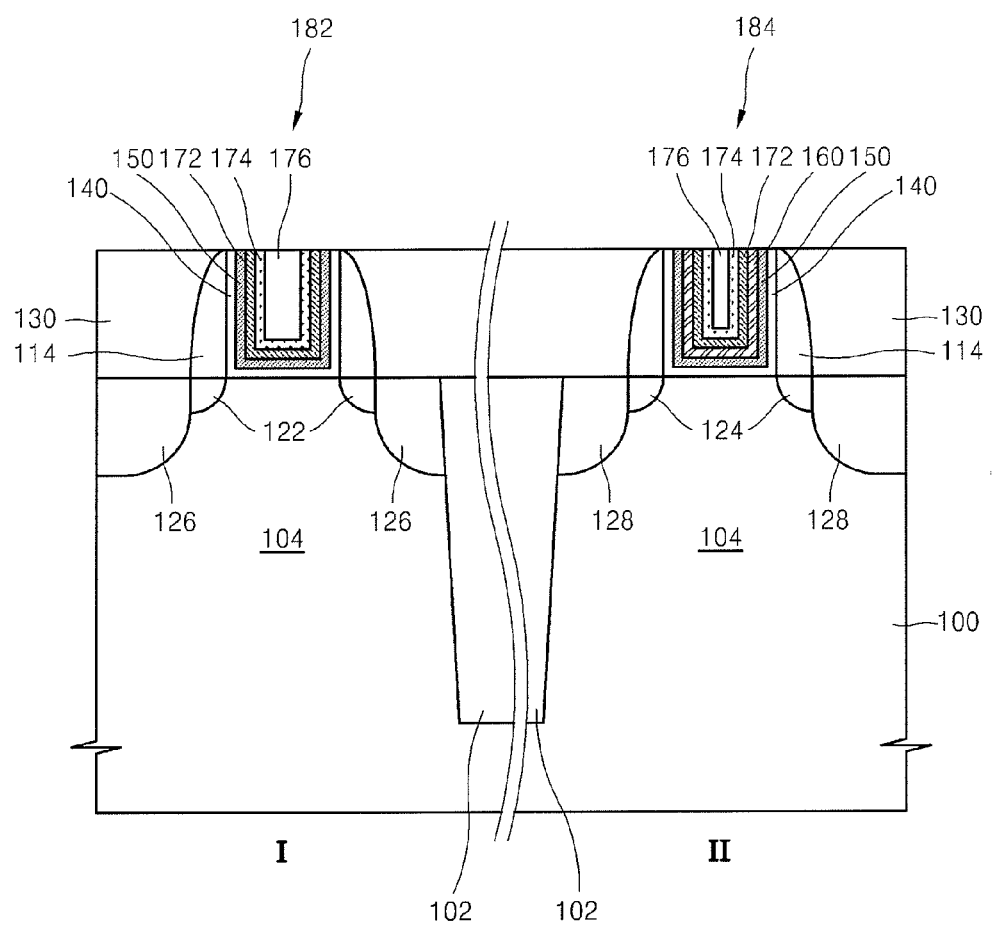

Referring to FIG. 2K, the resultant of FIG. 2J is planarized by using, for example, a CMP process to remove portions of the capping layer 176, the third metal stack layer 174, the second metal stack layer 172, the PMOS work function metal layer 160, the first metal stack layer 150 and the gate insulating layer 140 until an upper surface of the insulating layer 130 is exposed in the first region I and the second region II, so that the remaining capping layer 176, the remaining third metal stack layer 174, the remaining second metal stack layer 172, the remaining first metal stack layer 150 and the remaining gate insulating layer 140 located in the first region I constitute a first gate stacked structure 182 which remains in the first space S1 in the first region I and such that the remaining capping layer 176, the remaining third metal stack layer 174, the remaining second metal stack layer 172, the remaining PMOS work function metal layer 160, the remaining first metal stack layer 150 and the remaining gate insulating layer 140 in the second region II constitute a second gate stacked structure 184 which remains in the second space S2 in the second region II.

According to an exemplary embodiment of the inventive concept described with reference to FIGS. 2A through 2K, in forming different gate structures so as to include materials having different work functions in the first region I in which an NMOS transistor is formed and in the second region II in which a PMOS transistor is formed, when a predetermined layer is selectively removed only in one of the first region I and the second region II, a wet process using the above-described descum solution is used to remove resist residues, such as scum, that may be generated after forming a resist pattern to use a resist material as an etching mask. Accordingly, there is no need to use expensive and large-sized equipment commonly used in a process for removing resist residues such as scum by oxygen plasma or ultra violet (UV) irradiation. Further, the resist residues are effectively removed by using a relatively simple wet process without causing an undesirable deformation of the resist pattern.

FIGS. 3A through 3D, 4A through 4C, and 5A through 5C are cross-sectional views for explaining a method of manufacturing a semiconductor device, according to an embodiment of the inventive concept.

FIGS. 3A through 3D, 4A through 4C, and 5A through 5C illustrate a method of manufacturing a semiconductor device according to an exemplary embodiment of the inventive concept which is applied to a process for manufacturing a dynamic random access memory (DRAM) device.

Figure 3A:
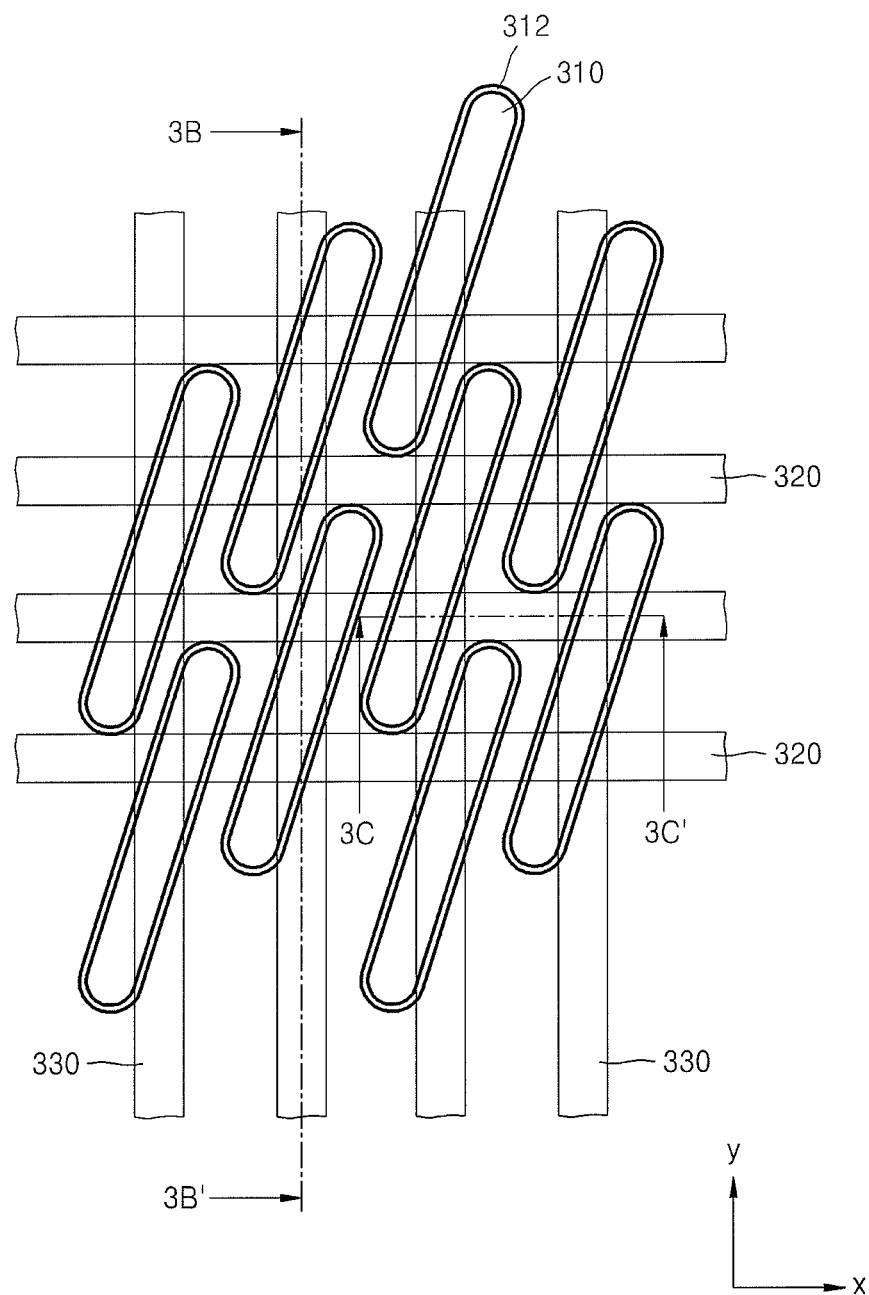
FIGS. 3A through 3D, 4A through 4C, and 5A through 5C are cross-sectional views for explaining a method of manufacturing a semiconductor device, according to an exemplary embodiment of the inventive concept.
Figure 3B:
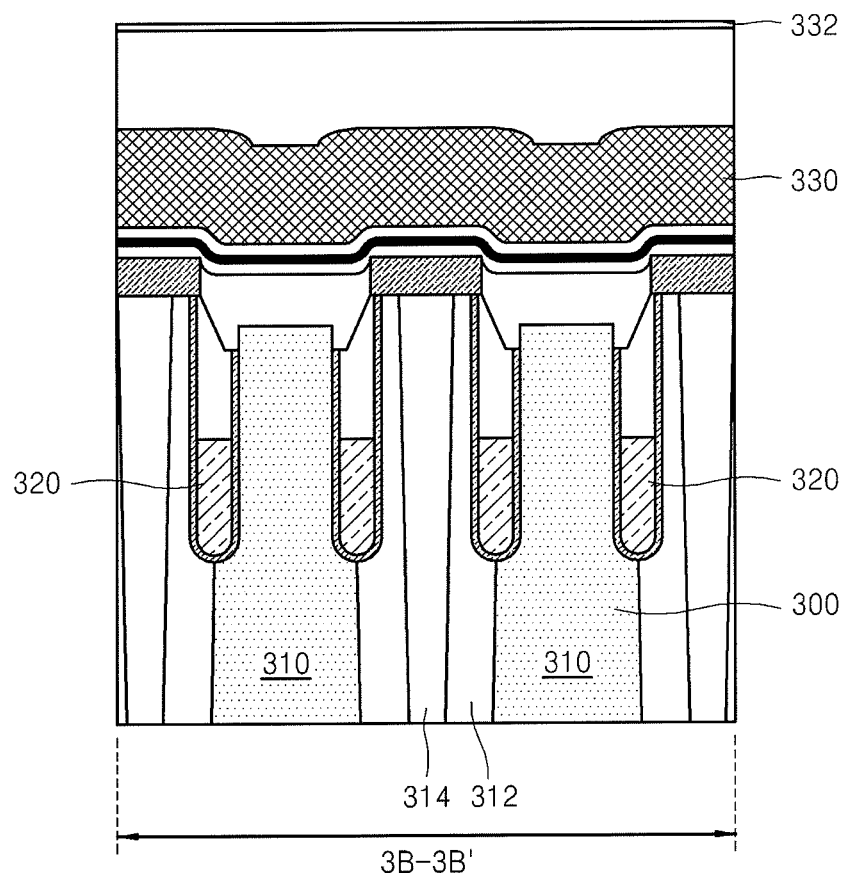
Figure 3C:
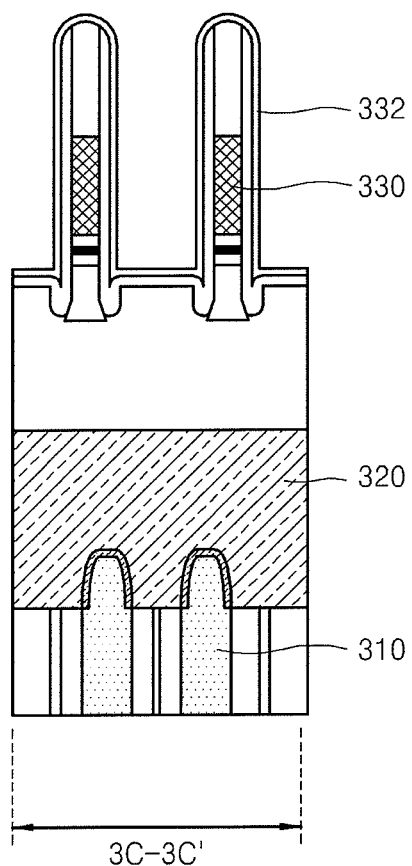
Figure 3D:
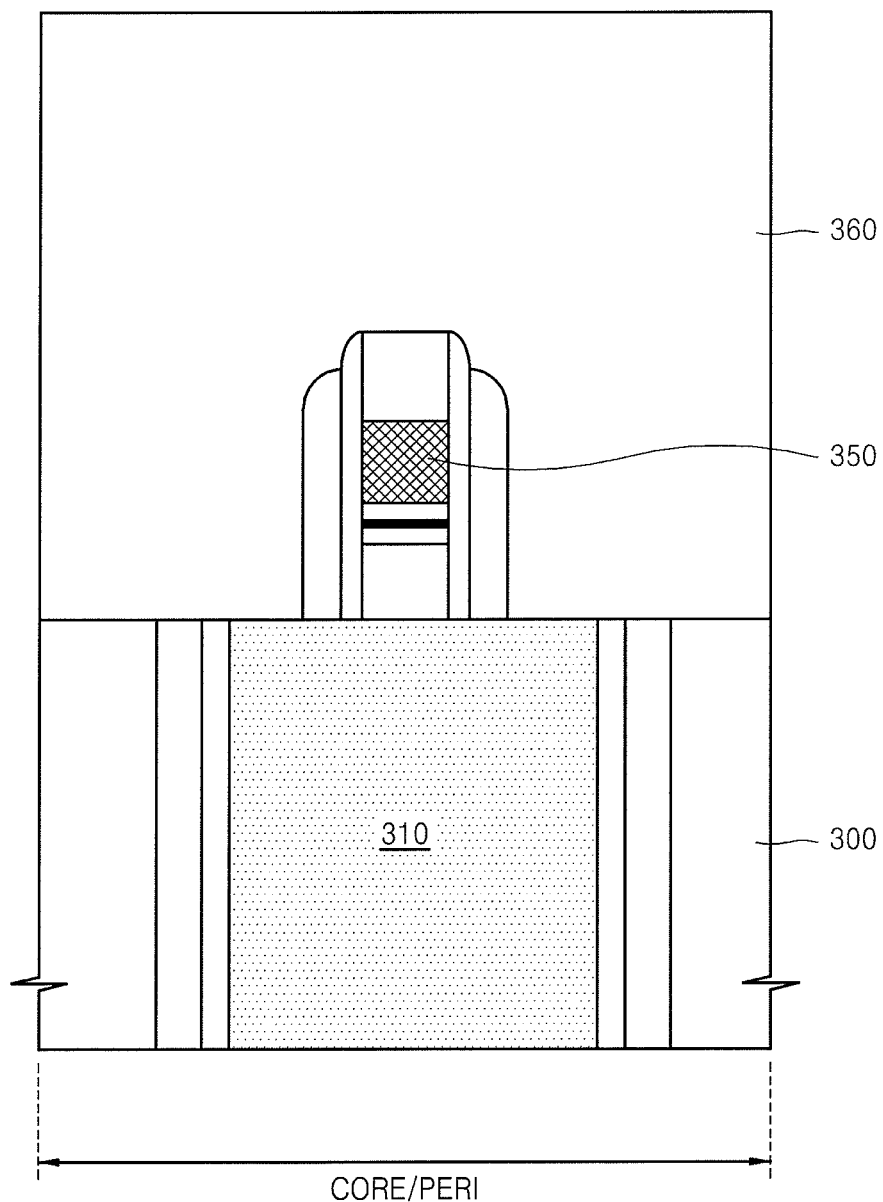

FIG. 3A is a layout illustrating main components of a memory cell region of a DRAM device. FIG. 3B is a cross-sectional view taken along a line 3B-3B' of FIG. 3A. FIG. 3C is a cross-sectional view taken along a line 3C-3C' of FIG. 3A. FIG. 3D is a cross-sectional view illustrating a core region or a peripheral circuit region (hereinafter, referred to as a core/peri region, and illustrated as CORE/PERI in FIG. 3D) located around the memory cell region illustrated in FIG. 3A in the DRAM device.

Referring to FIGS. 3A through 3D, a plurality of buried word lines 320 extend parallel to one another in a first direction, e.g, in an x direction in FIG. 3A, crossing a plurality of active regions 310. The active regions 310 are defined in a substrate 300 so as to be surrounded by a plurality of insulating layers 312 and a plurality of device isolation layers 314. A plurality of bit lines 330 extend parallel to one another in a second direction, e.g., in a y direction in FIG. 3A, crossing the first direction on the substrate 300 on the active regions 310 and the buried word lines 320.

A peripheral circuit gate electrode 350 is formed in the core/peri region illustrated in FIG. 3D.

As shown in FIGS. 3B and 3C, to form an insulating spacer on both side walls of each of the bit lines 330 formed in a cell array region, a spacer forming insulating layer 332 is entirely formed in the cell array region on the substrate 300 on which the bit lines 330 are formed. The spacer forming insulating layer 332 may be formed of, for example, any one selected from the group consisting of an oxide layer a nitride layer, and a combination thereof. Then, a resist pattern 360 covering the core/peri region is formed so as to expose the cell array region as illustrated in FIG. 3D.

Resist residues (not shown) such as, for example, scum may remain on a resultant in which the resist pattern 360 is formed, e.g., on a surface of the spacer forming insulating layer 332 in the cell array region. The resist residues remaining on the spacer forming insulating layer 332 may have an undesired negative influence in a subsequent process.

Figure 4A:
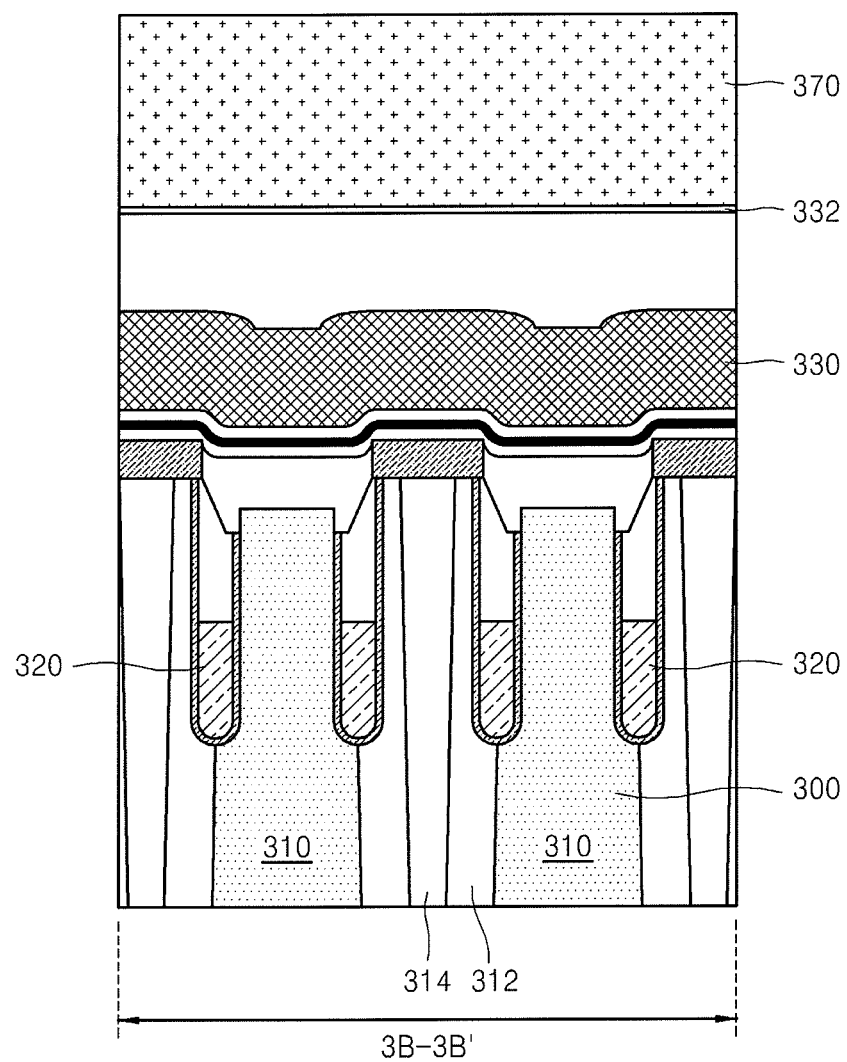
Figure 4B:
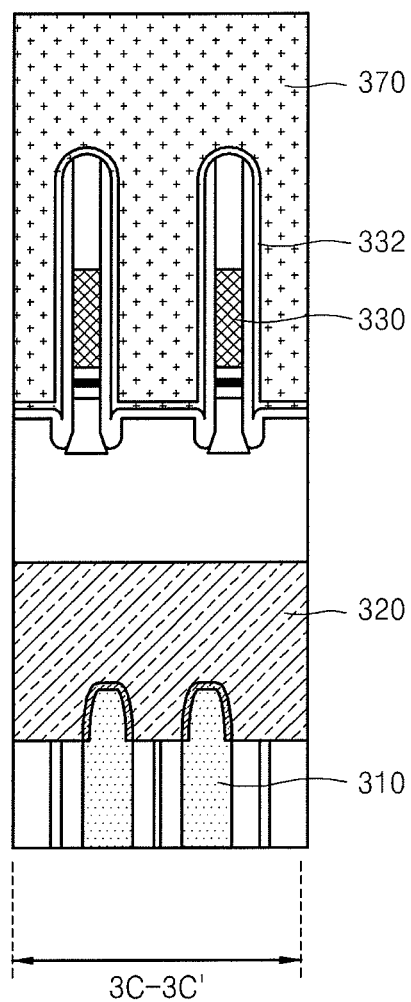
Figure 4C:
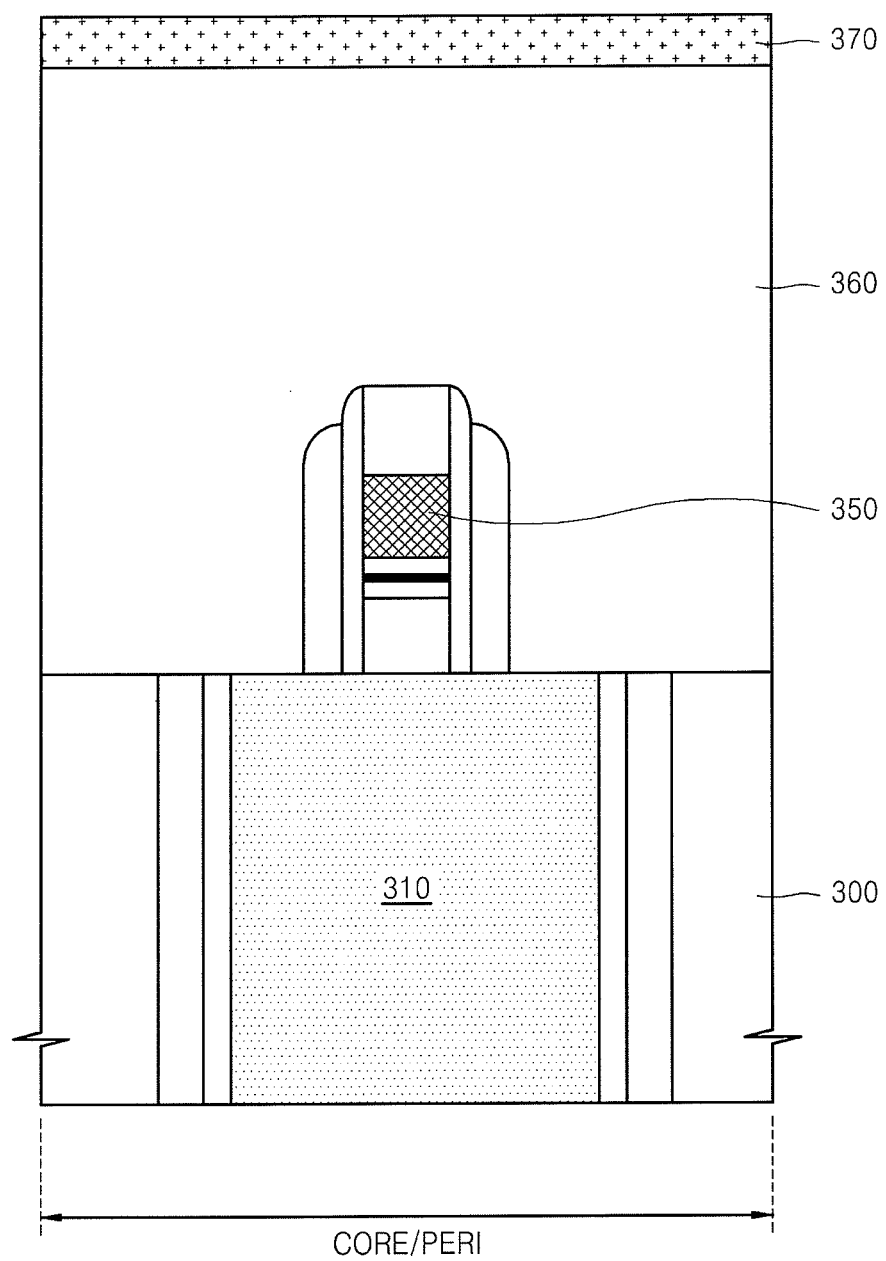

FIGS. 4A through 4C illustrate a case where the resultants of FIGS. 3B through 3D contact a descum solution 370 by using the method described with reference to FIG. 10.

The descum solution 370 may contact the resultant in which the spacer forming insulating layer 332 and the resist pattern 360 are formed by, for example, spin coating. Details about the descum solution 370 are the same as those about the descum solution 50 described with reference to FIG. 1C. After the descum solution 370 is coated on the resultant in which the spacer forming insulating layer 332 and the resist pattern 360 are formed as illustrated in FIGS. 4A-4C, a baking process is performed according to the conditions described with reference to FIG. 1C, and thus acid obtained from an acid source included in the descum solution 370 diffuses, thereby decomposing the resist residues (not shown).

Figure 5A:
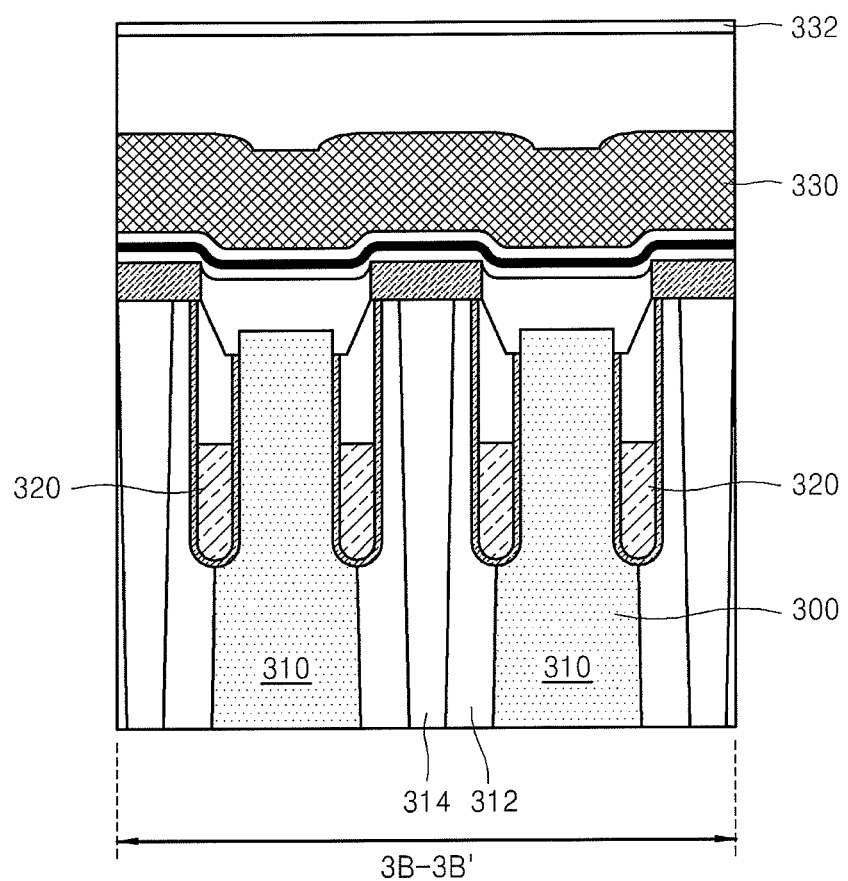
Figure 5B:
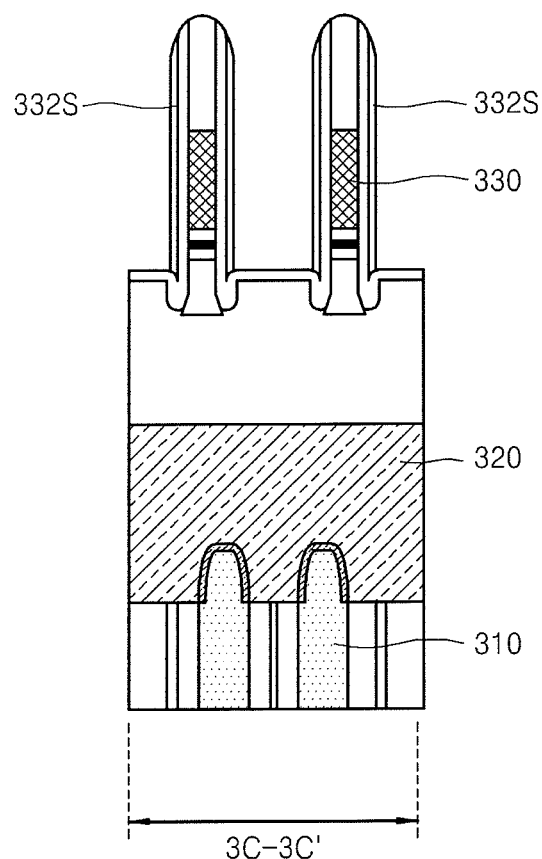
Figure 5C:
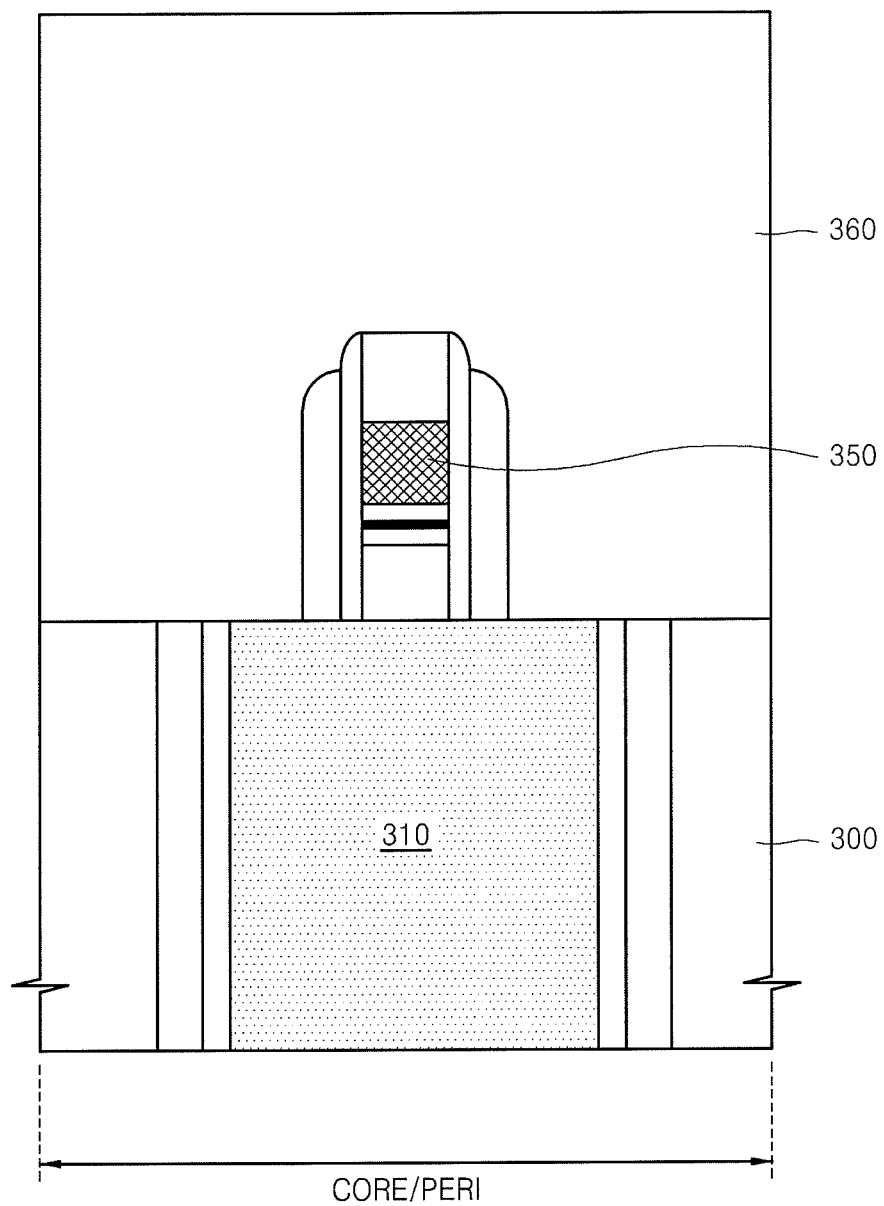

Referring to FIGS. 5A through 5C, the descum solution 370 is removed by using the method described above with reference to FIG. 1D with the resist residues decomposed by the reaction with the acid included in the descum solution 370. The resist residues decomposed during the removal of the descum solution 370 are also removed, and thus the surface of the spacer forming insulating layer 332 formed in the cell array region may be exposed in a clean state.

The descum solution 370 may be removed by using, for example, a rinse process using any one selected from the group consisting of deionized water, an alkali solution, and a combination thereof.

Then, as shown in FIGS. 5A-5C, an etch back process is performed on the spacer forming insulating layer 332 in the cell array region by using, for example, the resist pattern 360 as an etching mask, thereby forming a plurality of insulating spacers 332S on both side walls of each of the bit lines 330.

In the current embodiment, for example, in forming the insulating spacers 332S on the substrate 300 by selectively performing the etch back process on the spacer forming insulating layer 332 in the cell array region, a wet process using the above-described descum solution 370 may be used to remove resist residues such as scum that may be generated after forming the resist pattern 360 covering the core/peri region. Accordingly, there is no need to use expensive and large-sized equipment normally used in a process for removing resist residues such as scum by oxygen plasma or UV irradiation. Further, the resist residues are effectively removed by using a relatively simple wet process without causing an undesirable deformation of the resist pattern. In addition, undesired defects due to the resist residues may be prevented during the etch-back process performed in the cell array region, which is highly scaled and thus has a fine design rule.

In the current embodiment, a process for manufacturing the DRAM device having a buried gate structure has been described. For example, during the formation of the insulating spacers 332S in the cell array region in the current embodiment, the method according to an exemplary embodiment of the inventive concept is applied after forming the resist pattern 360 for protecting other portions. However, exemplary embodiments of the inventive concept are not limited thereto.

For example, the method may be applied to a process for manufacturing various devices such as a flash memory, a phase change random access memory (PRAM), a ferroelectric RAM (FRAM), a magnetic RAM (MRAM), a static RAM (SRAM), an embedded memory logic, a CMOS image sensor, or the like, and the method may be applied to various regions such as a cell array region, a core region, a peripheral circuit region, a logic region, an input/output region, or the like in these devices. In addition, a process for manufacturing a semiconductor device according to an exemplary embodiment of the inventive concept including a process of removing residues by diffusion of acid may be applied in various processes, such as, for example, an etching process, an ion implantation process, or a trimming process, using a resist pattern.

For example, in a process for manufacturing a flash memory, when a resist pattern is used as an etching mask for wire trimming during a wire pattern trimming process for forming a connection portion between a plurality of word lines and an X-decoder or a wire pattern trimming process for forming a connection portion between a plurality of bit lines and a Y-decoder, a process for removing residues due to diffusion of acid by using a descum solution may be applied, thereby increasing product yield.

Further, in a semiconductor device including a logic region having an NMOS transistor region and a PMOS transistor region, when applying a stress memorization technique (SMT), a dual stress liner (DSL), or a silicide blocking layer or applying a predetermined process using channel engineering technology, the above technologies may be applied only in one of the NMOS transistor region and the PMOS transistor region of the logic region to form a specific structure. At this time, a process for forming a specific structure may need to be performed only in the selected region with the unselected regions covered with a resist pattern so as not to undergo the process for forming the specific structure. However, when the process for forming a specific structure is performed in the selected region after forming the resist pattern, defects or yield deterioration may occur due to resist residues such as scum remaining on a surface of the selected region. According to exemplary embodiments of the inventive concept, before a process for configuring the specific structure in the selected region after forming the resist pattern in the unselected regions is performed, the resist residues such as scum may be removed from the selected region by using, for example, a wet process using the above-described descum solution. As such, the resist residues may be effectively removed by using a relatively simple wet process, thereby preventing generation of undesired defects during a semiconductor device manufacturing process.

In a method of manufacturing a semiconductor device according to an exemplary embodiment of the inventive concept, after a resist pattern is formed by performing exposing and developing processes, residues such as, for example, scum remaining on a substrate are removed by a wet process using diffusion of acid, and thus the residues can be effectively removed through a simple and low cost process without having a negative influence on shapes and performances of other components on the substrate, thereby increasing throughput of a product.

Having described exemplary embodiments of the inventive concept, it is further noted that various modifications can be made herein without departing from the spirit and scope of the invention as defined by the metes and bounds of the appended claims.

What is claimed is:

1. A method of manufacturing a semiconductor device, the method comprising:

forming a device isolation layer in a substrate including a first region and a second region to define a plurality of active regions in the substrate;
forming a plurality of sacrificial layer patterns on the first region and the second region of the substrate, respectively;
forming a plurality of insulating spacers on a sidewall of the sacrificial layer patterns in the first region and the second region;
filling an insulating layer between spaces defined by the insulating spacers between the sacrificial layer patterns;
removing the sacrificial layer patterns from the first region and the second region, so that the active regions of the substrate are exposed through a first space in the first region and a second space in the second region, respectively formed between an adjacent two of the insulating spacers;
conformally forming a gate insulating layer to cover exposed surfaces of the first space in the first region and the second space in the second region;
forming a first metal stack layer on the gate insulating layer in the first region and the second region;
forming a p-type metal-oxide semiconductor (PMOS) work function metal layer on the first metal stack in the first region and the second region;
forming a protective layer covering substantially an entire upper surface of the PMOS work function layer in the first region and the second region;
forming a resist pattern covering the protective layer in the second region and exposing a surface of the protection layer in the first region;
bringing a descum solution into contact with the exposed surface of the protection layer in the first region and with the resist pattern, wherein the descum solution comprises a water soluble polymer and a solvent;
performing a baking process on the descum solution;
removing the descum solution from the resist pattern and the exposed surface of the protection layer;
removing the protection layer exposed in the first region by using the resist pattern as an etching mask;
removing the resist pattern in the second region;
removing the PMOS work function metal layer in the first region using the protection layer remaining in the second region as an etching mask;
removing the protection layer remaining in the second region;
forming a second metal stack layer constituting an n-type metal-oxide semiconductor (NMOS) work function metal layer on the first region and the second region;
sequentially forming a third metal stack layer and a capping layer on the second metal stack layer in the first region and the second region; and
performing a planarization process on the capping layer until an upper surface of the insulating layer is exposed in the first region and the second region, such that a first gate stacked structure is formed which remains in the first space in the first region and a second gate stacked structure is formed which remains in the second space in the second region.

2. The method of claim 1, wherein a positive chemically amplified resist composition is used in forming the resist pattern.

3. The method of claim 1, wherein the descum solution further comprises an acid source comprised of one of acid or potential acid.

4. The method of claim 1, wherein the baking process is performed at a temperature of about 100° C. to about 150° C.

for about 20 seconds to about 70 seconds and wherein the protection layer exposed in the first region and the PMOS work function metal layer formed in the first region are both removed by a wet etching process.

5. The method of claim 1, wherein the planarization process includes removing a portion of the capping layer, the third metal stack layer, the second metal stack layer, the PMOS work function metal layer, the first metal stack layer and the gate insulating layer until the upper surface of the insulating layer is exposed in the first region and the second region, wherein the remaining capping layer, the remaining third metal stack layer, the remaining second metal stack layer, the remaining first metal stack layer and the remaining gate insulating layer each located in the first region constitute the first gate stacked structure, and wherein the remaining capping layer, the remaining third metal stack layer, the remaining second metal stack layer, the remaining PMOS work function metal layer, the remaining first metal stack layer and the remaining gate insulating layer each located in the second region constitute the second gate stacked structure.

* * * * *